US007846851B2

(12) United States Patent  
Shirley et al.

(10) Patent No.: US 7,846,851 B2  
(45) Date of Patent: Dec. 7, 2010

(54) METHOD AND APPARATUS FOR A TWO-STEP RESIST SOFT BAKE TO PREVENT ILD OUTGASSING DURING SEMICONDUCTOR PROCESSING

(75) Inventors: Paul Shirley, Meridian, ID (US); Gordon Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1269 days.

(21) Appl. No.: 10/765,481

(22) Filed: Jan. 27, 2004

(65) Prior Publication Data

US 2005/0164134 A1    Jul. 28, 2005

(51) Int. Cl.
    *H01L 21/00* (2006.01)
(52) U.S. Cl. .................. 438/795; 427/249.1
(58) Field of Classification Search .......... 438/795; 427/249.1
    See application file for complete search history.

(56) References Cited

U.S. PATENT DOCUMENTS 5,609,995 A * 3/1997 Akram et al. ............... 430/327

6,482,553 B1 * 11/2002 Gottert et al. ............... 430/5
7,459,241 B2 * 12/2008 Wago ........................ 430/1
7,534,470 B2 * 5/2009 Madou et al. ............ 427/249.1

OTHER PUBLICATIONS

Wolf and Tauber; Silicon Processing for the VLSI Era vol. 1: Process Technology; copyright 1986, Lattice Press; Sunset Beach, CA; pp. 429, 434-437, 452 and 453.*

* cited by examiner

*Primary Examiner*—Fernando L Toledo
(74) *Attorney, Agent, or Firm*—Fletcher Yoder

(57) ABSTRACT

A semiconductor wafer having no photoresist craters at the completion of a two-step post-apply resist bake (soft bake) in the fabrication of an integrated circuit. A process and method for soft baking the semiconductor wafer so that photoresist layers are free of surface voids or craters. The semiconductor wafer is coated with resist and then baked at both a low-bake temperature and a high-bake temperature. It is theorized that the lower temperature bake either hardens the resist layer before trapped air expands through the resist or displaces the trapped air while the resist layer remains fluid and returns to its conformal shape.

14 Claims, 3 Drawing Sheets

METHOD AND APPARATUS FOR A TWO-STEP RESIST SOFT BAKE TO PREVENT ILD OUTGASSING DURING SEMICONDUCTOR PROCESSING

BACKGROUND OF THE INVENTION

1. Field of the Invention

The present invention relates generally to the fabrication of integrated circuits and, more particularly, to soft baking a semiconductor wafer so that photoresist layers are free of surface voids or craters.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessors and memory devices, such as static and dynamic random access memories (DRAM and SRAM), are complex integrated circuits that are used in a wide variety of applications throughout the world. Such applications include personal computers, control systems, telephone networks, and a host of other consumer products. Despite their complexity, price competition requires that microprocessor and memory designs be inexpensive to manufacture while at the same time maintaining high performance and reliability. Furthermore, the relative size of these electronic devices is steadily decreasing as technology advances. Generally, the reduction in the overall footprint of electronic components is due to the consumer's demand for smaller, faster, and more powerful electronic devices.

Integrated circuits, such as memory devices, are fabricated on a semiconductor wafer using a variety of manufacturing processes, and they are generally mass produced by fabricating thousands of identical circuit patterns on a single semiconductor wafer and subsequently dividing them into identical die or chips. While integrated circuits are commonly referred to as "semiconductor devices," they are in fact fabricated from semiconductor wafers having various materials including semiconductors (such as silicon in the wafer substrate), conductors (such as metals or doped polysilicon), and insulators (such as silicon oxide used, for example, to separate conductive elements). To produce integrated circuits many commonly known processes are used to modify, remove, and deposit material onto the semiconductor wafer. Processes such as ion implantation, sputtering, etching, physical vapor deposition (PVD), chemical vapor deposition (CVD) and variations thereof, such as plasma enhanced CVD, are among those commonly used.

The various features and circuit elements may be patterned on the semiconductor wafer through the use of a masking process known as photolithography. In the masking process, a photomask containing the pattern of the structure to be fabricated is created, and the wafer is coated with a light-sensitive material called photoresist. The wafer is then baked (called a "soft bake" or "post-apply bake") to remove solvent from the resist and/or to harden the resist layer. The resist-coated wafer is then exposed to ultraviolet light through the photomask to develop the photoresist layer. After developing, an etchant may be use to remove selected portions of resist according to the desired pattern. Once the specified parts of the resist are removed, the wafer is treated by one of the processes (i.e., ion implantation, sputtering, etching, PVD, and CVD) mentioned above to modify the portions of the wafer unprotected by the resist. After such processing, the remaining resist is stripped or dissolved, using an appropriate solvent.

Conductive layers are generally separated by insulating layers, such as an interlayer dielectric (ILD), which may be, for example, silicon oxide, silicon nitride, or a polyimide film. After an ILD layer is applied to cover the conductive layer, the ILD layer may then be coated with photoresist to start the masking/patterning of the next conductive layer. A problem, however, with application of ILD layers and subsequent resist layers is the typical formation of air pockets between elements or structures on the semiconductor wafer surface. The ILD material and/or resist material, for example, may not conform to the surface of the semiconductor wafer but instead form a bridge between structures on the wafer, resulting in gaps underneath the ILD layer or resist layer.

One of the objectives in photolithography is to transfer a well-defined pattern with minimal ambiguities or anomalies. As mentioned above, photoresist, when applied, may contain a solvent that makes it semi-fluid to facilitate its deposition onto the wafer. Once applied, the "soft bake" process displaces the solvent from the resist and hardens the resist layer. In the soft bake, the wafer is baked, for example, at 130° C. for 90 seconds in a thermal unit, in a temperature chamber, or on a hot plate. One of the problems during the soft bake is that air trapped below the resist layer heats and expands to the surface of the resist. The escaping air bursts through the resists to form craters as the resist hardens because the resist is generally not fluid enough to re-form. Subsequent etching of affected areas (craters) of the resist layer may adversely affect the desired pattern as well as portions of the underlying topology. Typically, tens, hundreds, or even thousands of microscopic craters may be formed on a single semiconductor wafer.

Consecutive layers of ILD material and/or relatively large amounts of ILD material may fill gaps in the underlying topology and thus reduce the amount of air that is trapped. Furthermore, consecutive, thick layers of ILD may also act as a more effective barrier that reduces the amount of air reaching the resist layer, and thus reduces the number of craters. However, the excessive use of ILD material and other inefficient approaches are costly and may not reduce or eliminate the formation of resist craters.

The present invention may be directed to one or more of the problems set forth above.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
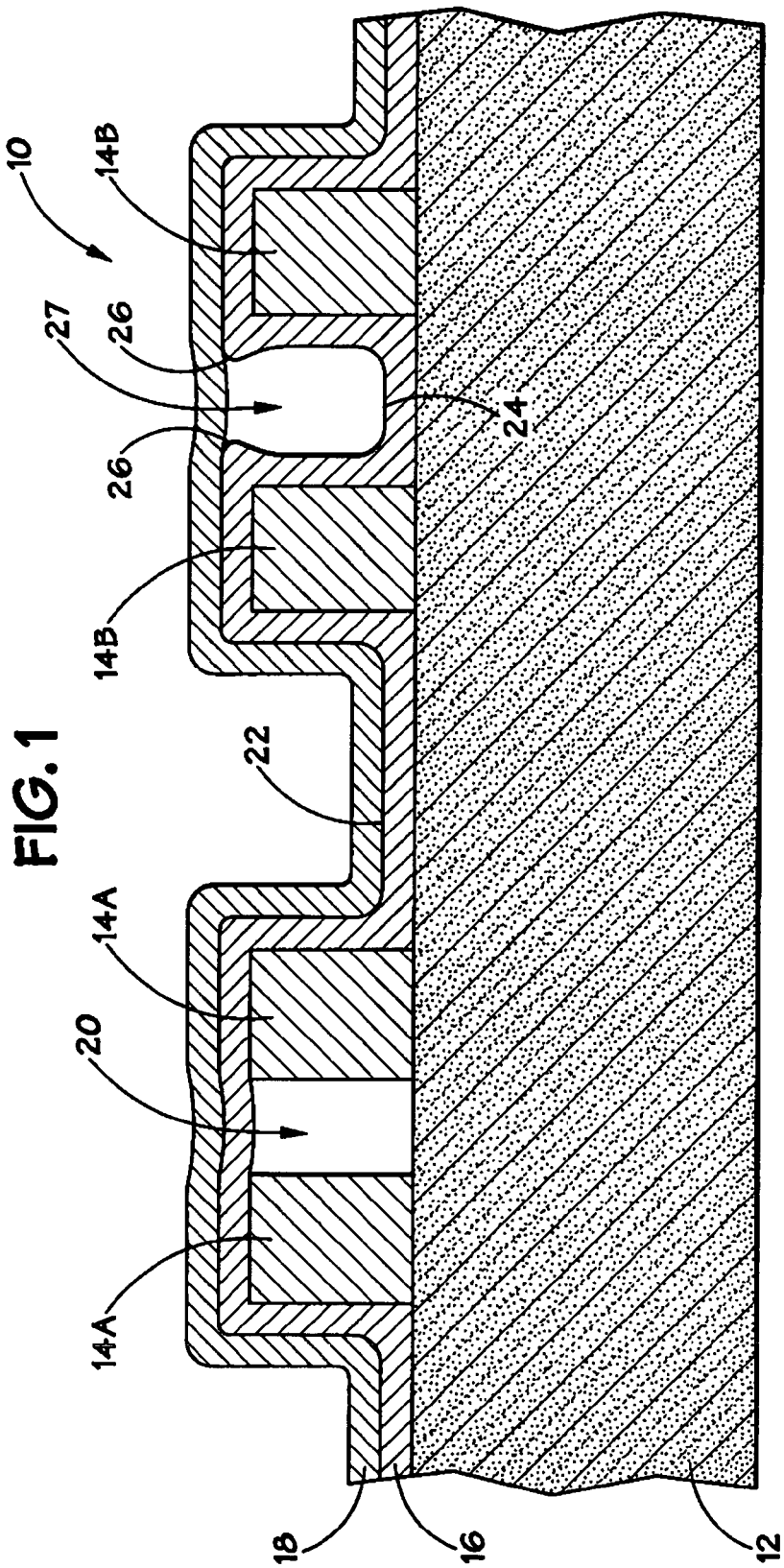
FIG. 1 illustrates a cross-sectional view of an exemplary semiconductor wafer in accordance with the present techniques.

Turning now to the drawings, and referring initially to FIG. 1, a cross-sectional view of a semiconductor wafer 10 having a substrate 12, features 14, a coating 16, and a resist layer 18, is illustrated. The substrate 12 may represent a metal layer (such as aluminum, tungsten, and/or titanium), some other conductive layer (such as doped polysilicon), or a semiconductor substrate (such as polysilicon or silicon). The features 14 represent structures that extend above the height of the underlying topology of the substrate 12. Such features 14 may be conductive lines, for example. The features 14A may be densely spaced, while the features 14B may be remotely spaced. The coating 16 may be a dielectric, such as an interlayer (ILD) used to separate and/or insulate wafer conductive (i.e., metal or polysilicon) layers. For example, if the coating 16 is an ILD layer, it may be silicon oxide, silicon nitride, or a polyimide film. Interlayer dielectrics may be deposited using any suitable ILD deposition technique known to the art.

In this illustrative embodiment, the coating 16, when applied to the underlying topology, leaves a void 20 between dense features 14A and provides a conformed coating at sections 22 and 24 between the isolated features 14B. Additionally, depending on the rheology of the coating 16 and the distance between features, the ILD layer 16 may form a neck 26, such as between the isolated features 14B. After application of the coating 16, a layer of photoresist 18 is applied in preparation for the next photo/etch processing step. As the resist layer 18 is coated on top of the coating 16, it deposits conformably over the coating 16 above the void 20 and over the section 22, but due to the neck 26, the resist layer 18 bridges between the features 14B above the section 24. Thus, air is trapped in the void 27 created above the section 24.

As described previously, problem during a single-step soft bake is that trapped air may expand to the surface of the resist layer, forming craters in the solidifying resist. For example, in semiconductor wafer 10, trapped air will expand in the voids 20 and 27. Although it is unlikely that the trapped air in the void 20 would expand with enough force to break through both the coating 16 and the resist 18 during a single-step soft bake, the likelihood of the air trapped in the void 27 breaking through only the resist layer 18 is much higher. Again as mentioned previously, air escaping to the surface of resist layer 18 may form craters as the resist solidifies. Of course, trapped air may also expand from void 20 through pinholes in the coating 16 to the resist surface, thus also resulting in resist craters. Subsequent etching of the affected areas (craters) may destroy the underlying topology. It should be noted that absent additional inefficient measures (e.g., the application of excessive ILD material), a single-step soft bake of a semiconductor wafer having a topology similar to wafer 10 will typically result in the formation of at least one crater in the resist layer 18.

As discussed above, to decrease the number of craters, a second ILD layer (not shown) may be applied on top of the ILD layer 16 before application of the resist layer 18. This second ILD layer may reduce the amount of air expanding into the resist during the soft bake, and thus may reduce the number of craters formed in the resist. Before depositing the second ILD layer, a technique, such as chemical mechanical planarization (CMP) or isotropic dryetch, may be used to remove excess material from the ILD layer 16, leaving the surface smoother with smaller gaps between in the underlying topology. The second ILD layer may then be applied and will be more conformal on the smooth surface, facilitating application of a photoresist layer in preparation of photo processing of the next conductive layer.

To avoid use of the second ILD layer and thus avoid the expenditure of resources associated with a consecutive ILD layer, and while also preventing the formation of resist craters, the semiconductor wafer 10 may be subjected, in accordance with embodiments of the presently claimed techniques, to a two-step soft bake instead of a single-step soft bake. For example, the semiconductor wafer 10 is first baked at a lower temperature, such as in the range of 30-75° C., below the normal soft bake temperature range. The wafer is then baked at a temperature within a typical single-step soft bake range (e.g., 100-130° C.). The result is that no resist craters are formed in the solidifying resist. Resist craters are eliminated, with or without a consecutive ILD layer, and with more or less ILD material.

One theory for this result is that the lower temperature bake drives the solvents out of the resist, making the resist less fluid, but does not introduce enough energy into the trapped air in the gaps (i.e., in the voids 10 and/or 27) to make the air expand to the point of pushing through the resist layer 18. Thus, when the wafer 10 is then baked at the regular temperature, the resist 18 has solidified enough so that the air can not pass through the resist 18.

A second theory is that the lower bake temperature allows the resist to remain fluid long enough so that the air, as it expands in the voids 20 and 27, can pass through the resist layer 18. The resist 18 flows back to its original conformal shape. During the subsequent higher temperature bake, the amount of air in the voids 20 and 27 has been reduced to the point where the air does not have the energy to pass through the hardening resist 18.

Figure 2:
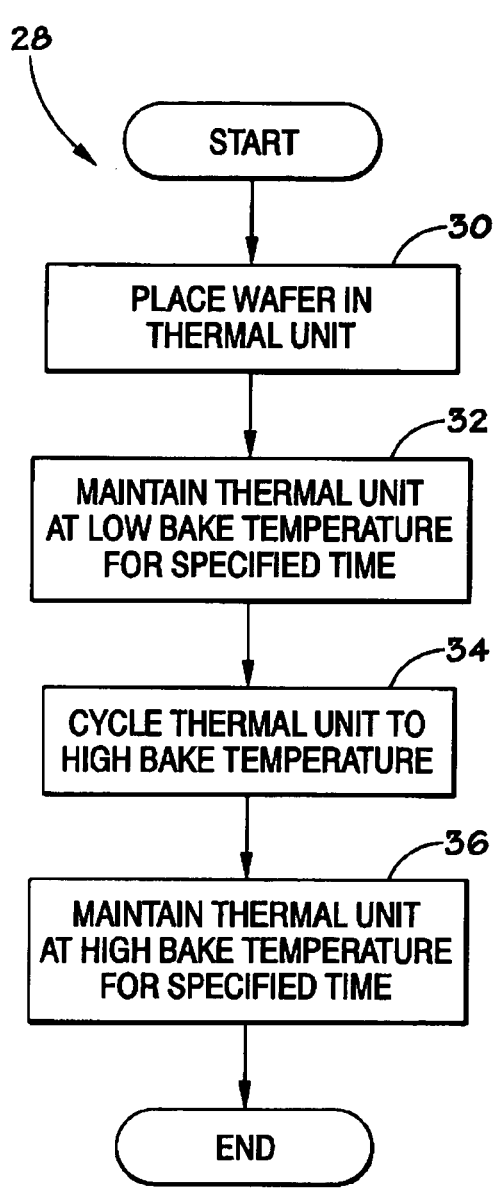
FIG. 2 illustrates a block diagram of an exemplary embodiment of a two-step soft bake process in accordance with the present techniques.

Referring now to FIG. 2, a block diagram of one example of a two-step soft bake process 28, is illustrated. In block 30, the semiconductor wafer 10 coated with resist 18 is placed in a thermal unit. The thermal unit may be, for example, a temperature chamber, oven, or the like. In block 32, the thermal unit is maintained at a low bake temperature in the range of 30-75° C. for a specified time typically in the range of 30-90 seconds. In block 34, the thermal unit is cycled to a higher bake temperature, for example, to a temperature in the range of 90-150° C. In block 36, the thermal unit is maintained at the higher bake temperature for a specified time typically in the range of 60-90 seconds.

In another exemplary configuration, two thermal units, instead of only a single thermal unit, may be used. For example, one thermal unit, such as a temperature chamber or oven, may be used for the low bake (i.e., 30-75° C.), and another thermal unit may be used for the high bake (i.e., 90-150° C., the temperature range of the single-step soft-bake). In this example the wafer 10 is passed from one thermal unit to the other, so the thermal units do not cycle between the low bake and the high bake temperatures.

Figure 3:
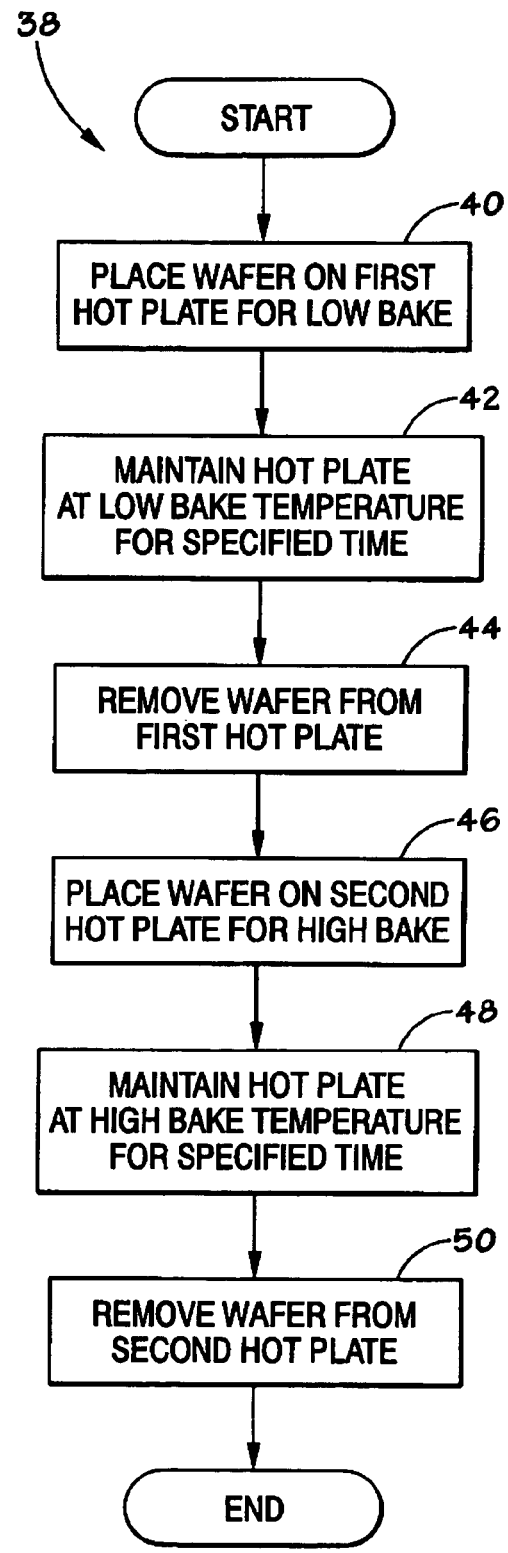
FIG. 3 illustrates a block diagram of an alternate exemplary embodiment of two-step soft bake process in accordance with the present techniques.

Referring now to FIG. 3, a block flow diagram of another exemplary embodiment of a two-step soft-bake process 38 is illustrated. In block 40, the wafer 10 coated with the resist 18 is placed on a first hot plate. The hot plate may be preheated to a temperature within the low bake temperature range of 30-75° C., for example. In block 42, the hot plate temperature is maintained within the low bake temperature range for a specified time, such as in the range of 30-90 seconds. The low-bake time may be increased to more than 90 seconds, or may also be decreased, for example, to 30 seconds or lower, depending on various conditions. In blocks 44 and 46, the wafer 10 is removed from the first hot plate and placed on a second hot plate, which may be preheated to a temperature within the high bake temperature range. In block 48, the hot plate temperature is maintained within the high bake range, typically in the range of 100-130° C. used for the single-step soft bake. Wider temperature ranges, such as 90-150° C., may also be used. The hot plate is maintained at the high bake temperature normally for 60 to 90 seconds. Finally, in block 50, the wafer 10 is removed from the second hot plate.

Figure 4A:
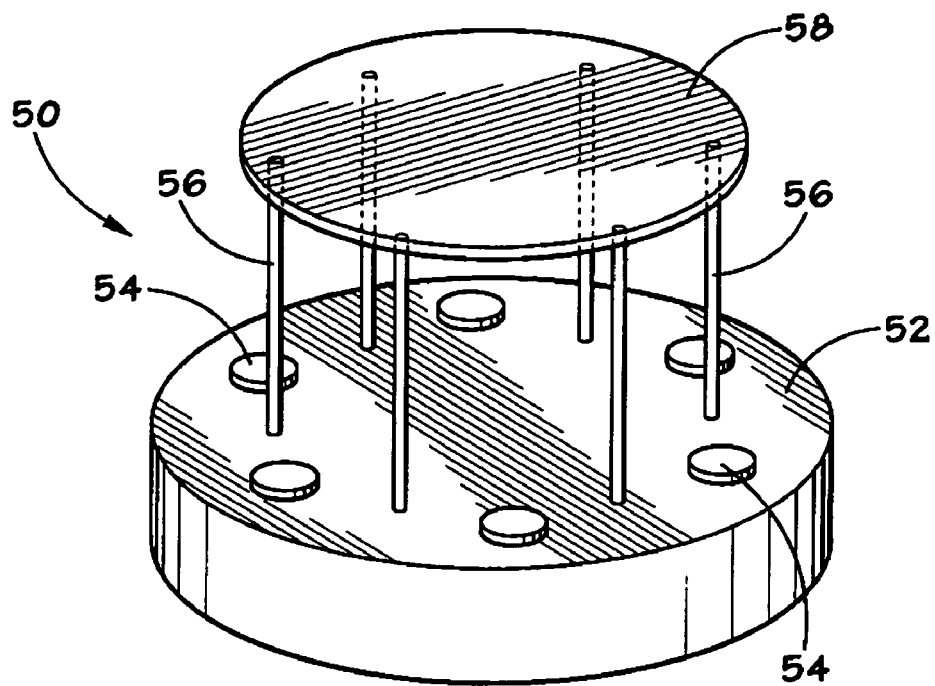
FIG. 4A illustrates a perspective view of an exemplary hot plate used in a soft bake process in accordance with the present techniques with offset pins in an extended position to facilitate a low bake temperature.

It should be apparent that a variety of configurations of thermal units, temperature chambers, ovens, hot plates, and other heating devices may be used to bake a wafer, such as wafer 10 (FIG. 1), for specified times at desired temperatures associated with a two-step soft bake. Another such example is set forth in FIGS. 4A and 4B. Referring now to FIG. 4A, a perspective view of a hot plate 50 that maybe used in both a low bake and a high bake of a two-step soft bake process in accordance with the present techniques is illustrated. The hot plate 50 has a surface 52, disks 54, and pins 56. The pins 56 extend from the hot plate to receive a wafer 58. Disks 54 may reduce contamination between the hot plate surface and the wafer. The pins 56 extend from the hot plate surface 52 and receive the wafer 58, for example, from an automated machine. Under normal circumstances, the pins 56 immediately retract to bring the wafer to rest on the hot plate for a single-step soft bake. However, in this embodiment, the pins 56 remain extended to hold the wafer 58 above the hot plate surface 52 to perform the low bake.

Figure 4B:
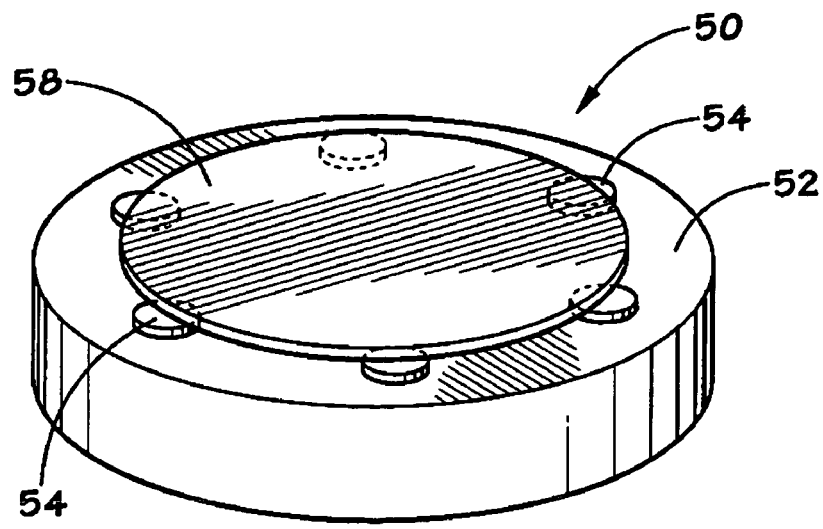
FIG. 4B illustrates a perspective view of the hot plate of FIG. 4A with the offset pins in a retracted position to facilitate a higher bake temperature.

In this configuration, the temperature of the hot plate surface 52 is held at the same temperature, i.e., within a typical high-bake temperature range of 90-150° C., during both the low bake and the high bake. The length of the pins 56 are sized so that radiant heat from surface 52 maintains the wafer 58 at a low bake temperature (e.g., in the range 30-75° C.) during the low bake for a suitable period of time. At the completion of the low bake, the pins 56 retract into the hot plate 50 to place the wafer 58 on disks 54 for the high bake. FIG. 4B is a perspective view of the hot plate 50 with pins 56 retracted into the hot plate 50. The wafer 56 sits atop disks 54 (e.g., 0.12 mm high) located on the hot plate surface 52.

It should be apparent that the hot plate 50 and/or other heating devices may be used in a variety of process configurations that implement a two-step soft bake in accordance with embodiments of the present techniques. For example, hot plate 50 may be used to conduct both the low and high bakes with the pins 56 extended initially to receive the wafer 58 but retracted during both bakes. The hot plate surface 52 is maintained at a low bake temperature (e.g., 60° C.) during the low bake. The hot plate temperature is then cycled to a high bake temperature (e.g., 130° C.) for the high bake.

In yet another example, one hot plate 50 is used to perform the low bake and another hot plate 50 is used to perform the high bake. On both hot plates 50, the pins 56 are retracted and the wafers 58 sit atop disks 54 (as illustrated in FIG. 4B) during the respective bakes. Finally, it should be noted that a variety of hot plates, with or without pins or disks, with differing geometries, and/or in conjunction with other heating devices, such as ovens, and the like, may be used to accomplish two-step soft bakes in accordance with the present techniques.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of soft-baking a semiconductor wafer comprising the acts of:
   (a) soft-baking a semiconductor wafer comprising a substrate having a plurality of features formed thereon at a first temperature for a first predetermined period of time, wherein the plurality of features is coated with a resist such that, at the time act (a) begins, at least one unfilled void is present under the resist and between two of the plurality of features; and
   (b) after act (a), soft-baking the semiconductor wafer at a second higher temperature for a second predetermined period of time.

2. The method, as set forth in claim 1, wherein no resist craters are formed.

3. The method, as set forth in claim 1, wherein during the first predetermined period of time:
   the resist hardens; and
   air trapped in the at least one unfilled void under the resist does not possess sufficient energy to expand through the resist.

4. The method, as set forth in claim 1, wherein during the first predetermined period of time:
   the resist remains fluid;
   air trapped in the at least one unfilled void under the resist expands through the resist to the surface; and
   the resist flows back to its original conformal shape.

5. The method, as set forth in claim 1, wherein the semiconductor wafer is subjected to a temperature in the range of 30-75° C. during the first predetermined period of time.

6. The method, as set forth in claim 1, wherein the first predetermined period of time is less than 90 seconds.

7. The method, as set forth in claim 1, wherein the first predetermined period of time is more than 90 seconds.

8. The method, as set forth in claim 1, wherein the higher temperature is in the range of 90-150° C.

9. The method, as set forth in claim 1, wherein the higher temperature is in the range of 100-130° C.

10. The method, as set forth in claim 1, wherein the second predetermined period of time is less than 90 seconds.

11. The method, as set forth in claim 1, wherein the second predetermined period of time is more than 90 seconds.

12. The method, as set forth in claim 1, wherein subsequent to acts (a) and (b), the at least one unfilled void remains present under the resist.

13. A method of soft-baking a semiconductor wafer, comprising the acts of:
   (a) soft-baking a substrate having a plurality of features coated with a resist at a first temperature of between approximately 30 to 75 degrees ° C. for a first predetermined period of time using a first thermal unit; and
   (b) after act (a), soft-baking the substrate at a second higher temperature of between approximately 90 to 150 degrees ° C. for a second predetermined period of time using a second thermal unit.

14. The method, as set forth in claim 13, wherein:
   prior to acts (a) and (b), at least one unfilled void is present under the resist and between two of the plurality of features; and
   subsequent to acts (a) and (b), the at least one unfilled void remains present under the resist.

* * * * *

UNITED STATES PATENT AND TRADEMARK OFFICE
CERTIFICATE OF CORRECTION

PATENT NO.       : 7,846,851 B2                                    Page 1 of 1
APPLICATION NO.  : 10/765481
DATED            : December 7, 2010
INVENTOR(S)      : Paul Shirley et al.

It is certified that error appears in the above-identified patent and that said Letters Patent is hereby corrected as shown below:

In column 7, line 8, in Claim 13, after "75" delete "degrees".

In column 8, line 1, in Claim 13, before ""° C." delete "degrees".

Signed and Sealed this
First Day of March, 2011

David J. Kappos
*Director of the United States Patent and Trademark Office*